(12) United States Patent
Onobori et al.

(10) Patent No.: US 7,281,322 B2
(45) Date of Patent: Oct. 16, 2007

(54) COMPONENT MOUNTING METHOD

(75) Inventors: Shunji Onobori, Kadoma (JP); Shozo Minamitani, Kadoma (JP); Shuichi Hirata, Kadoma (JP); Tomoaki Nakanishi, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/426,735

(22) Filed: Jun. 27, 2006

(65) Prior Publication Data

US 2007/0006454 A1    Jan. 11, 2007

(30) Foreign Application Priority Data

Jul. 7, 2005    (JP) .............................. 2005-198331

(51) Int. Cl.
*H05K 3/30*    (2006.01)

(52) U.S. Cl. .......................................... 29/832; 29/840

(58) Field of Classification Search .................. 29/832, 29/833, 834, 840
See application file for complete search history.

(56) References Cited

U.S. PATENT DOCUMENTS

| | | | | |
|---|---|---|---|---|
| 4,521,828 A | * | 6/1985 | Fanning | 361/715 |
| 4,617,708 A | * | 10/1986 | Fanning | 29/25.42 |
| 4,884,237 A | * | 11/1989 | Mueller et al. | 365/63 |
| 6,462,408 B1 | * | 10/2002 | Wehrly, Jr. | 257/686 |
| 6,572,387 B2 | * | 6/2003 | Burns et al. | 439/69 |
| 6,608,763 B1 | * | 8/2003 | Burns et al. | 361/790 |
| 6,806,120 B2 | * | 10/2004 | Wehrly, Jr. | 438/109 |
| 6,919,626 B2 | * | 7/2005 | Burns | 257/686 |
| 7,066,741 B2 | * | 6/2006 | Burns et al. | 439/69 |
| 7,098,073 B1 | * | 8/2006 | Mangrum | 438/107 |
| 7,196,427 B2 | * | 3/2007 | Mangrum | 257/778 |

FOREIGN PATENT DOCUMENTS

JP            3132353       11/2000

\* cited by examiner

*Primary Examiner*—Carl J. Arbes
(74) *Attorney, Agent, or Firm*—Pearne & Gordon LLP

(57) ABSTRACT

In a component mounting apparatus in which integrated components having a chip-on-chip structure are formed by mounting upper chips on lower chips. The lower chips picked up from a component carrying-in unit by a component carrying-in head are placed on a mounting stage, and the upper chips picked up from a second component tray by a component transporting head are vertically flipped around a rotation axis and transferred to a mounting head at a component transferring position, then the upper chips held by the mounting head are descended and mounted by solder bonding on the lower chips held by the mounting stage at a component mounting position. Integrated components formed by mounting are carried out of the mounting stage by the component transporting head and stored in a first component tray in a component storing unit.

3 Claims, 12 Drawing Sheets

COMPONENT MOUNTING METHOD

BACKGROUND OF THE INVENTION

1. Field of the invention

This invention relates to a component mounting apparatus and a component mounting method in which another component is mounted on one component in a stacked manner.

2. Related Art

In field of manufacturing electronic devices, component mounting operations are performed such that semiconductor chips are mounted on a work like circuit boards etc. In such a component mounting operation, there are two operations: a transporting and placing operation where semiconductor chips in which connection terminals such as solder bumps are formed are picked up from a component feeding unit and placed on a board, and a bonding operation where the connection terminals of the semiconductors are bonded to circuit terminals on the board. For an apparatus to perform such component mounting operations, there is known conventionally a component mounting apparatus includes a component flipping mechanism which picks up semiconductor chips from the component feeding unit and flips them vertically, and a mounting head which mounts the semiconductor chips transferred from the component flipping mechanism on the board (see, for example, Japanese Patent No. 313253).

According to the recent progress in downsizing and sophisticating electronic devices, it has been required to further improve board density mounted in electronic devices. To respond to such the requirement of high density mounting, semiconductor devices with so-called chip-on-chip (COC) structure made by stacking plural semiconductor chips have been widely adopted. Such a semiconductor device is manufactured by mutually bonding bumps on circuit forming faces opposed each other in a pair of semiconductor chips.

However, since the component mounting apparatus shown in the above patent publication is configured for applications in which semiconductor chips are transported and mounted on a board which has a relatively large size such that the board can be easily handled, the apparatus is not always suitable to bond a pair of semiconductor chips having almost the same size to each other. Accordingly, there has been desired a component mounting apparatus and a component bonding method which can effectively perform a component mounting operation to manufacture semiconductor devices having a chip-on-chip structure.

SUMMARY OF THE INVENTION

This invention has been made in view of the above circumstances, and an object of the invention is to provide a component mounting apparatus and a component bonding method which can effectively perform a component mounting operation to manufacture semiconductor devices having a chip-on-chip structure.

A component mounting apparatus of the invention is: a component mounting apparatus which mounts a second component on a first component, including:

a first component feeding unit which feeds a first component;

a second component feeding unit which feeds a second component;

a mounting stage on which a first component is placed;

a mounting unit which holds and mounts the second component on the first component placed on the mounting stage by a mounting head; and a component transporting unit which transports the first component from the first component feeding unit to the mounting stage, and which picks up the second component from the second component feeding unit and transfers to the mounting head.

A component mounting method of the invention is: a component mounting method of mounting a second component on a first component, comprising the steps of:

a placing step of placing a first component on a mounting stage by a component transporting unit;

a holding step of holding a second component which is transferred to a mounting head by the component transporting unit; and a mounting step of mounting the second component held by the mounting head on the first component placed on the mounting stage.

According to the invention, in the component mounting operation that the second component is mounted on the first component, the first component is transported to the mounting stage by the component transporting unit, and then the second component transferred from the component transporting unit is mounted on the first component by the mounting head. By this construction, it is possible to effectively perform component mounting operation for manufacturing semiconductor devices having COC structure.

DETAILED DESCRIPTION OF THE PREFERRED EMBODIMENTS

Embodiment 1

Figure 1:
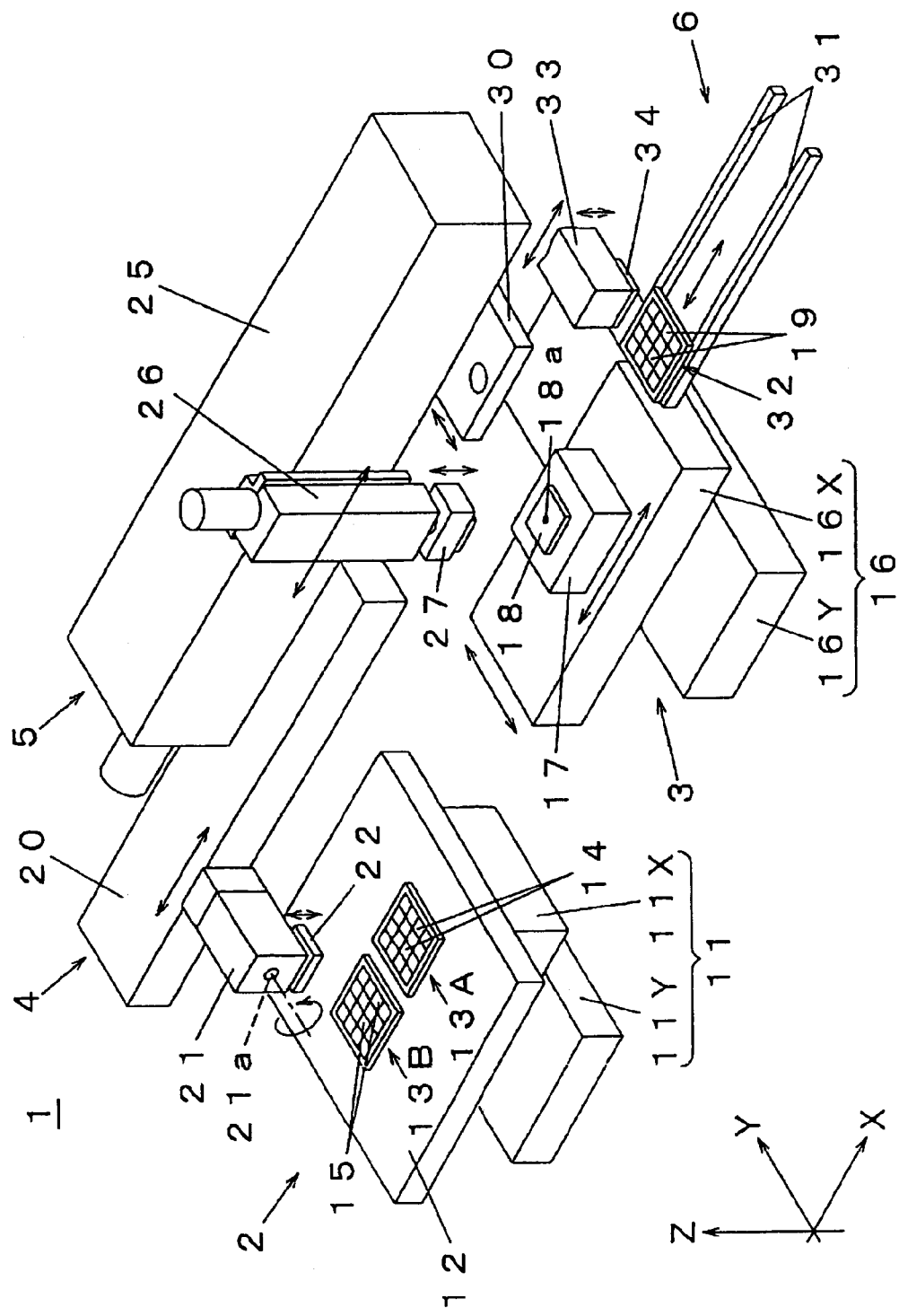
FIG. 1 is a perspective view showing a component mounting apparatus according to Embodiment 1 of the present invention.
Figure 2:
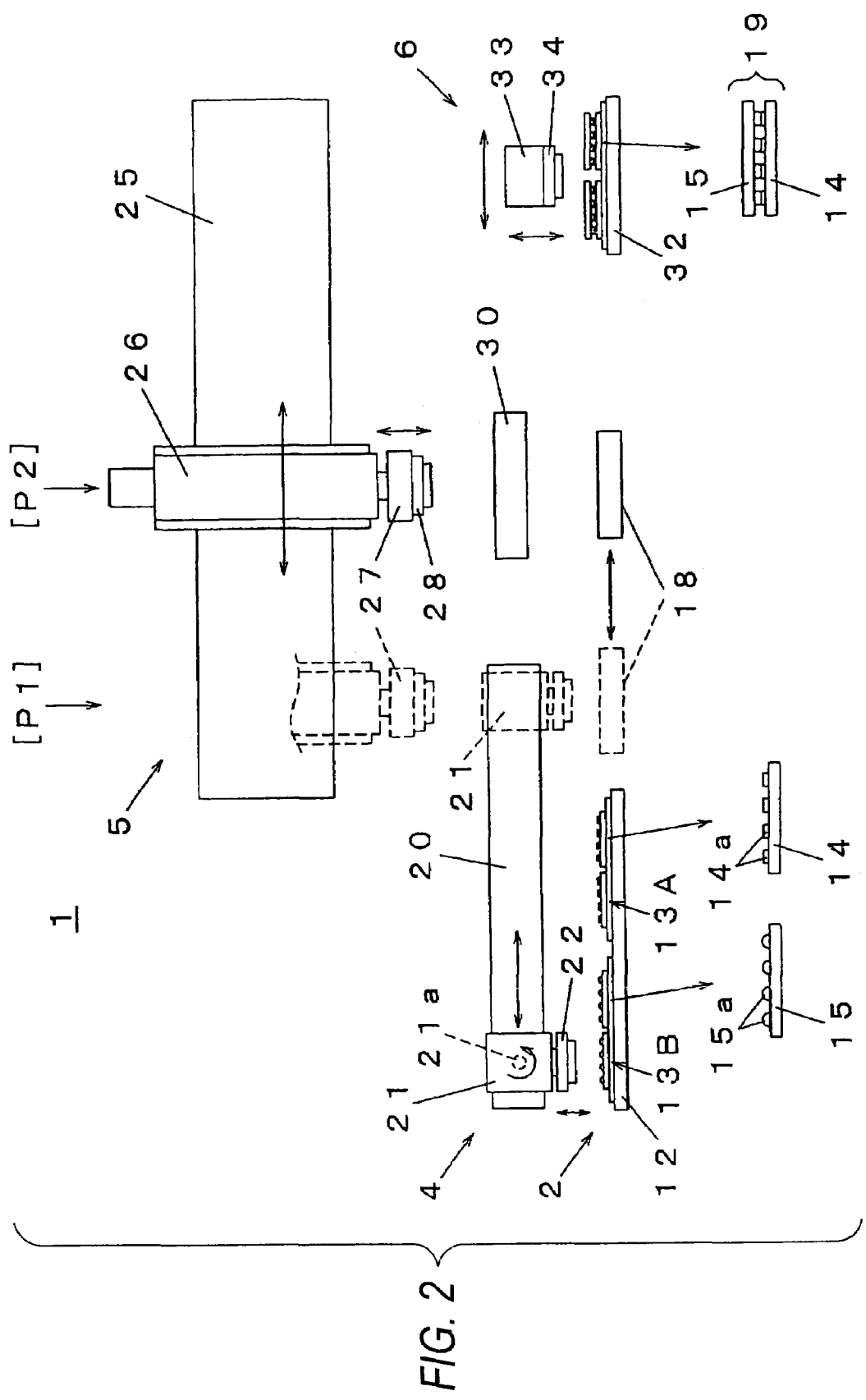
FIG. 2 is a front view showing the component mounting apparatus according to Embodiment 1 of the present invention.

FIG. 1 is a perspective view showing a component mounting apparatus according to Embodiment 1 of the present invention; FIG. 2 is a front view showing the component mounting apparatus according to Embodiment 1 of the present invention; and FIGS. 3A through 4D are process explanatory views showing a component mounting method according to Embodiment 1 of the present invention.

Referring to FIGS. 1 and 2, the structure of a component mounting apparatus 1 will be described below. The component mounting apparatus 1 is served for manufacturing integrated components (semiconductor devices) having COC structure made by mounting semiconductor chips with substantially the same size in a directly stacked manner. In FIG. 1, the component mounting apparatus 1 is configured so that a component feeding unit 2 and a component positioning unit 3 are arranged serially in X direction (component transportation direction), and above these units, a component transporting unit 4 and a component mounting unit 5 are arranged so as to extend in X direction. On right side of the component positioning unit 3, a component carrying-out unit 6 is disposed for carrying out the component after mounting operation.

Construction of these units will be described below. The component feeding unit 2 is provided by mounting a component storing table 12 on a positioning table 11 in which an X-axis table 11X and a Y-axis table 11Y are combined. On an upper face of the component storing table 12, a first component tray 13A and a second component tray 13B are held. The lower chips 14, each of which is first component of the invention, and the upper chips 15, each of which is second component of the invention are regularly arranged in a grid pattern and stored in the first component tray 13A and the second component tray 13B, respectively.

By driving the positioning table 11, the first component tray 13A and the second component tray 13B on the component storing table 12 are horizontally moved in X direction and Y direction. By this construction, the lower chips 14 and the upper chips 15 are positioned with respect to the component transporting unit 4, so that the lower chips 14 and the upper chips 15 are picked up by the component transporting unit 4 and fed to the component positioning unit 3 and the component mounting unit 5. Thus, the second component tray 13B constitutes the component feeding unit which feeds the upper chips 15 as the second component.

Each of the lower chips 14 and each of the upper chips 15 are rectangular components having almost the same size compared to each other. As shown in FIG. 2, connection terminals 14a are provided on a circuit forming face on each of the lower chips 14, and solder bumps 15a are provided on a circuit forming face on each of the upper chips 15. Both of the lower chips 14 and the upper chips 15 are stored in the first component tray 13A and the second component tray 13B respectively with so-called "face-up position" that the circuit forming faces are faced the upper side. The component mounting apparatus 1 perform a component mounting operation of stackingly mounting the upper chips 15 picked up from the second component tray 13B on the lower chips 14 picked-up from the first component tray 13A. This mounting operation is performed by placing the upper chips 15 on the lower chips 14 and solder bonding the solder bumps 15a to the connection terminals 14a in each pair of the upper chip 15 and the lower chip 14. Incidentally, the bonding method of the upper chip 15 and the lower chip 14 is not limited to the solder bonding between the solder bumps 15a and the connection terminals 14a, and bonding with adhesives or resins such as Anisotropic Conductive Adhesive (ACF) may be used. Ultra-sonic bonding may be also used. Further, material of the bumps, in a case such components are provided with bumps, is not limited to solder and gold, silver, cupper, indium and the like may be selected in a suitable manner.

The component positioning unit 3 is configured by mounting a movable block 17 on a positioning table 16 in which an X-axis table 16X and a Y-axis table 16Y are combined. The mounting stage 18 on which the lower chips 14 are placed is provided on an upper face of the movable block 17. A suction hole 18a is formed on the mounting stage 18 so that the lower chips 14 are sucked and held on the mounting stage 18 by vacuum suction from the suction hole 18a in a state that the lower chip 14 is placed on the mounting stage 18.

By driving the positioning table 16, the mounting stage 18 is moved horizontally in X direction and Y direction. Accordingly, the lower chip 14 on the mounting stage 18 is positioned with respect to the component mounting unit 5. In addition, when the lower chip 14, which is picked up from the component storing unit 2 by the component transporting unit described below, is placed on the mounting stage 18, the mounting stage 18 is located at a component transferring position [P1] as shown in FIG. 2 by moving the mounting stage 18 toward left side in X direction by the Y axis table 16Y.

The component transporting unit 4 is configured so as to be capable of reciprocating a component transporting head 21 in X direction with a transportation block 20. The component transporting head 21 includes a component holding nozzle 22 which can hold both of the lower chip 14 and the upper chip 15. The component holding nozzle 22 is configured to be capable of ascending and descending by an actuating mechanism installed in the component transporting head 21. Further the component transporting head 21 is made rotatable 180 degrees around a rotation axis 21 extending in Y direction. By this construction, the component holding nozzle 22 can be operated in two postures of upward direction and downward direction.

Namely, the component transporting head 21 can pick up the lower chip 14 and the upper chip 15 from the component feeding unit 2 using the component holding nozzle 22 and also can flip the upper chip 15 vertically, by rotating the component holding nozzle 22 by 180 degrees so that the component holding nozzle 22 is turned to the upward face posture. When the lower chip 14 is picked up from the first component tray 13A and placed on the mounting stage 18, the component holding nozzle 22 that holds the lower chip 14 is moved to the component transferring position [P1] as shown in FIG. 2, and then the component holding nozzle 22 is descended and ascended to place the held lower chip 14 on the mounting stage 18.

The component mounting unit 5 is configured to be capable of reciprocating a mounting head 27 in X direction with a transportation table 25. The mounting head 27 is configured to ascend and descend by a head actuation mechanism 26, and includes a component holding nozzle 28 to hold the upper chip 15 in a "face-down position". By moving the component transporting head 21 that have picked up the upper chip 15 from the second component tray 13B to the component transferring position [P1] as shown in FIG. 2 and flipping the component transporting head 21 vertically, and simultaneously by moving the mounting head 27 to the component transferring position [P1], the upper chip 15 held by the component holding nozzle 22 can be transferred to the mounting head 27.

At this time, the upper chip 15 that was in the face-up position facing the solder bumps 15a upward on the second component tray 13B is transferred to the mounting head 27 in the face-down position facing the solder bumps 15a downward, being flipped vertically by the component transporting head 21. Thus, the component transporting unit 4 constitutes a component transporting unit which transports the lower chip 14 from the first component tray 13A to the mounting stage 18 and which transfers the upper chip 15 picked up from the second component tray 13B to the mounting head 27.

Then, after receiving the upper chip 15, the mounting head 27 moves to the component mounting position [P2] and conducts descending and ascending operation so that the upper chip 15 is mounted on the lower chip 14 placed on the mounting stage 18 moved to the component mounting position [P2]. The mounting head 27 includes a heating device inside thereof, so that the upper chip 15 can be heated through the component holding nozzle 28.

In the mounting operation in which the upper chip 15 held by the mounting head 27 is descended toward the lower chip 14 placed on the mounting stage 18 so that the solder bumps 15a are brought into contact with the lower chips 14, by heating the upper chips 15 with the mounting head 27, the solder bumps 15a are melted to bonded to the connection terminals 14a by solder bonding. Accordingly, the upper chip 15 is mounted on the lower chip 14. The component mounting unit 5 constitutes a mounting unit which holds the upper chip 15 by the mounting head 27 and mounts the upper chip 15 on the lower chip 14 placed on the mounting stage 18.

A recognizing unit 30 is arranged diagonally above the component positioning unit 3. The recognizing unit 30 includes dual view optical systems which can image both of an upward view and a downward view in a single imaging operation and is configured to be movable in Y direction by a movement mechanism (not-shown). In a state that the lower chip 14 is place on the mounting stage 18 and that the mounting head 27 holding the upper chip 15 by suction is located directly above the mounting stage 18, the recognizing unit 30 is interposed between the mounting stage 18 and the mounting head 27 so that the lower chip 14 and the upper chip 15 can be imaged by the same imaging operation for recognition. The recognizing unit 30 constitutes a recognizing unit of the invention which optically recognizes the lower chip 14 on the mounting stage 18 and the upper chip 15 held by the mounting head 27.

The component carrying-in unit 6 which is disposed on right side of the component positioning unit 3 includes a component storage tray 32 which is movable in X direction by a transportation conveyer 31 and a component carrying-in head 33 on which a component holding nozzle 34 that can hold the upper chip 15 by suction is mounted. The component carrying-in head 33 can reciprocate in X direction and perform ascending and descending operation by a transporting head actuating mechanism (not-shown). Using this construction, the component carrying-in head 33 can conduct a carrying operation of the components between a mounting stage 18 located at a component mounting position [P2] and the component storage tray 32 located at left end of the transportation conveyer 31, so that the integrated components 19 which have been formed by mounting the upper components 15 on the lower components 14 on the mounting stage 18 are carried out to the component storage tray 32. Thus the component mounting head 33 constitutes a component carrying-out unit which carries the upper chips 15 mounted on the lower chips 14 out of the mounting stage 18 together with the lower chips 14.

Figure 3A:
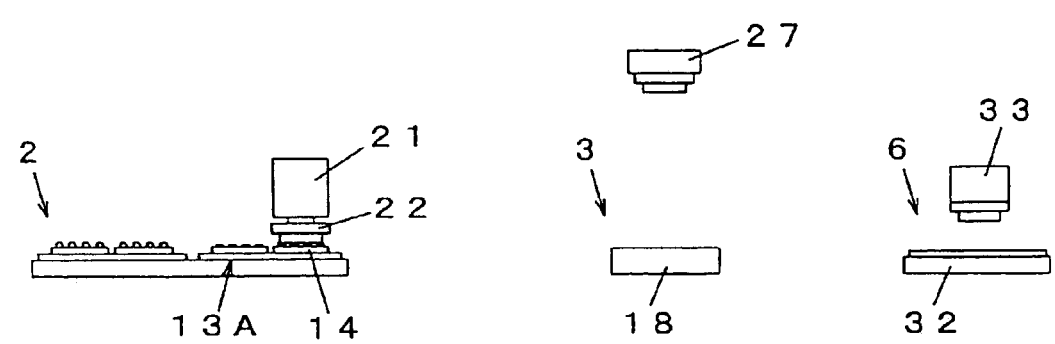
FIGS. 3A-3D depict views of steps in a component mounting method according to Embodiment 1 of the present invention.
Figure 3B:
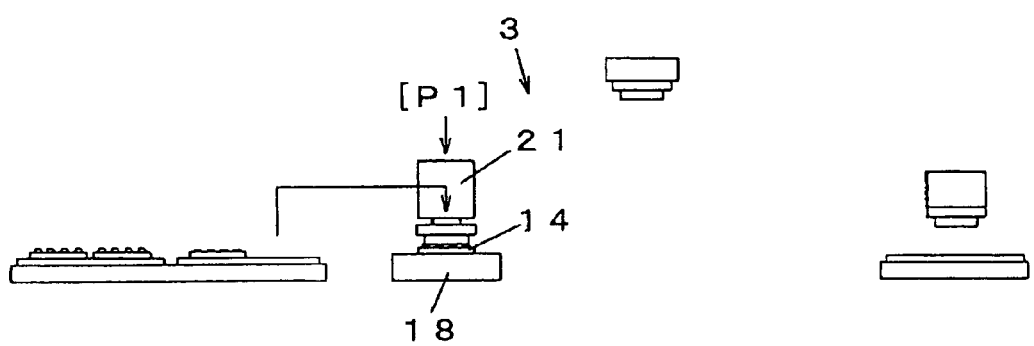

Next, referring to FIGS. 3A to 4, a component mounting operation performed by the component mounting apparatus 1 will be described. As shown in FIG. 3A, the component transporting head 21 is moved above the first component tray 13A of the component feeding unit 2. Then, the component holding nozzle 22 is positioned to the lower chip 14 as a mounting object and descended to hold the lower chip 14 from the circuit formation side thereof by suction. After that, as shown in FIG. 3B, the component transporting head 21 is moved to the component transferring position [P1] in the chip positioning unit 3, and places the lower chip 14 on the mounting stage 18 that have been moved to the component transferring position [P1] previously (placing step).

Figure 3C:
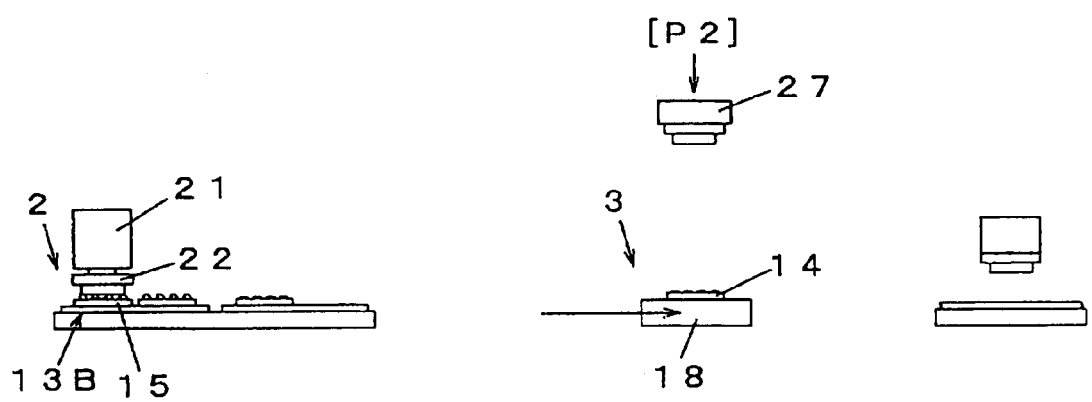

After that, the component transporting head 21 which has been released the lower chip 14 from the holding of the component holding nozzle 22 is moved to the above of the component positioning unit 3 as shown in FIG. 3C. Then the component holding nozzle 22 is positioned with respect to the upper chip 15 on the second component tray 13B and descended to hold the upper chip 15. Along with the above operation, the mounting stage 18 on which the lower component 14 is placed returns to the component mounting position [P2] in the component positioning unit 3.

Figure 3D:
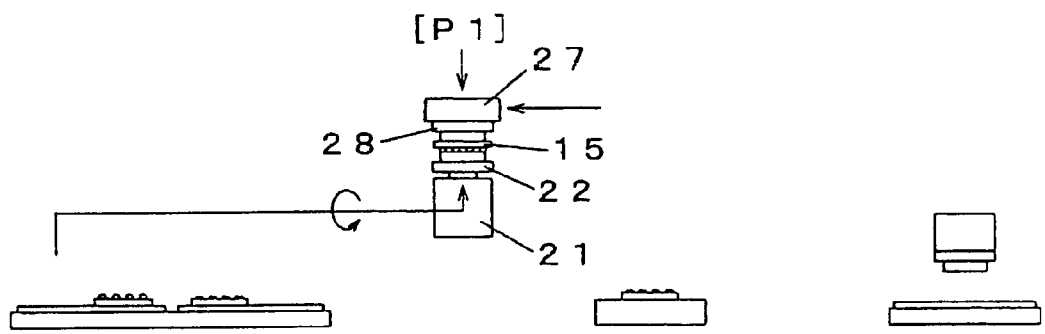

Subsequently, the component transporting head 21 picks up the upper chip 15 held through the component holding nozzle 22 from the second component tray 13B, and moves toward the component transferring position [P1]. In a middle of the movement to the component transferring position [P1], the component transporting head 21 is rotated 180 degrees to flip vertically the upper chip 15 held through the component holding nozzle 22 as shown in FIG. 3D. Then by ascending the component transporting head 21 from a lower side of the mounting head 27, the component holding nozzle 28 of the mounting head 27, which have already moved from the component mounting position [P2] to the component transferring position [P1], holds the upper chip 15 by suction in the face-down position, facing the circuit forming face downward (holding step).

Figure 4A:
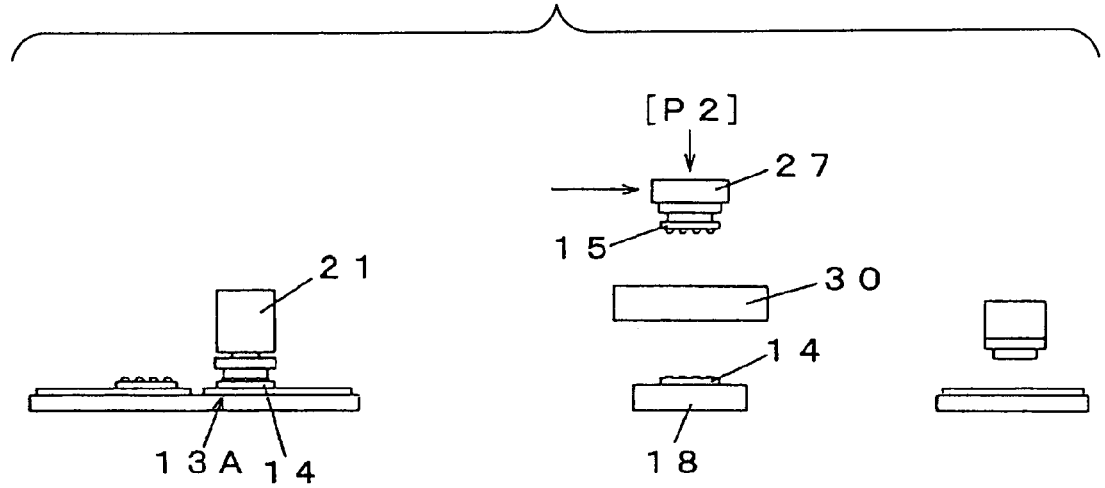
FIGS. 4A-4D depict views of steps in a component mounting method according to Embodiment 1 of the present invention.

After moving the mounting head 27 holding the upper chip 15 to the component mounting position [P2] , the recognizing unit 30 is interposed between the mounting stage 18 and the mounting head 27, as shown in FIG. 4A, so that the recognizing unit 30 images the lower chip 14 and the upper chip 15 by the same imaging operation using the dual view optical systems provided in the recognizing unit 30. Imaging result is processed for recognition by recognition means (not-shown) so that the connection terminals 14a of the lower chip 14 and the solder bumps 15a of the upper chip 15 are recognized. Based on this recognition result, positional inconsistency between the connection terminals 14a and the solder bumps 15a is detected.

Figure 4B:
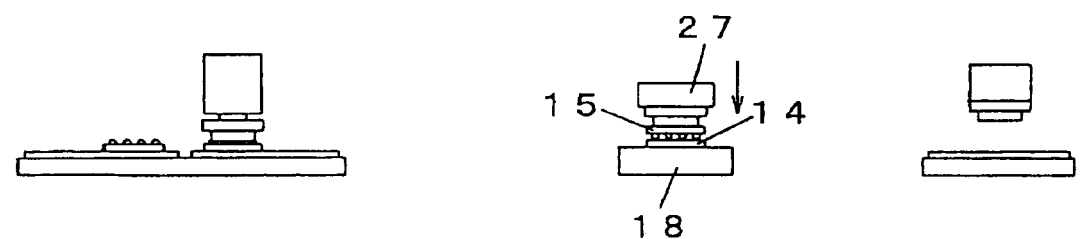
Figure 4C:
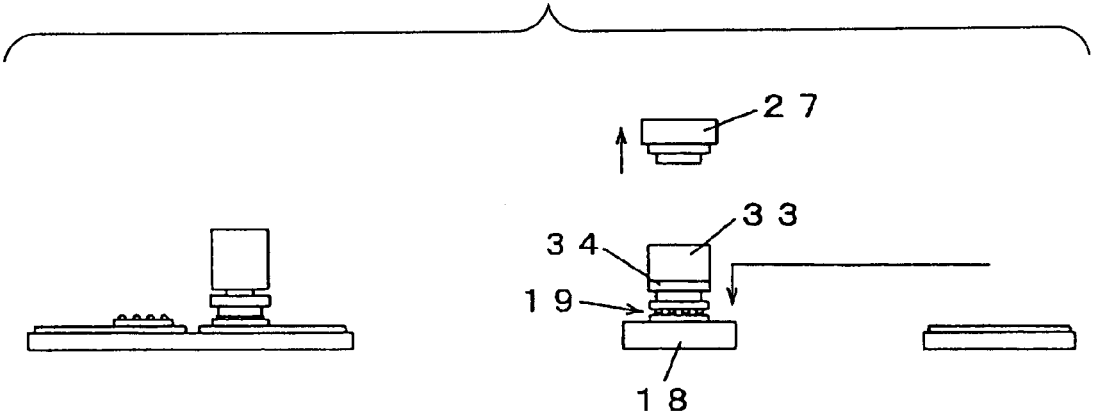
Figure 4D:
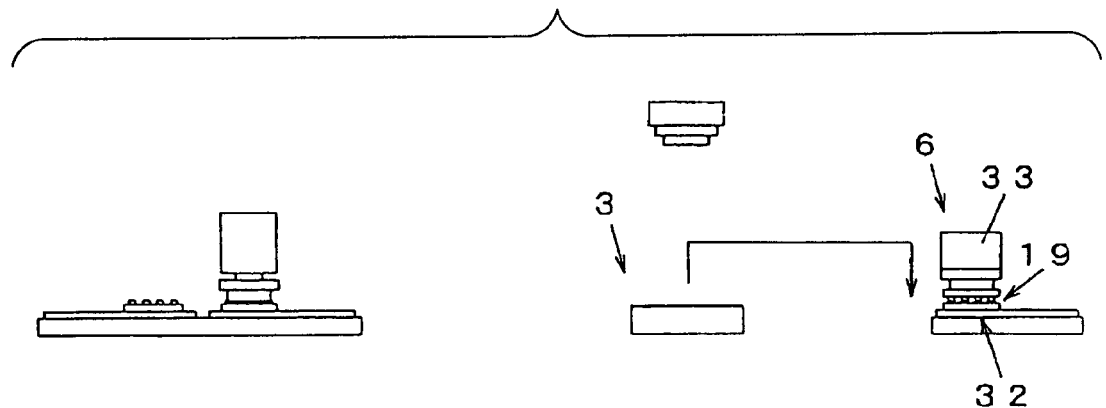

After the recognizing unit 30 is retreated from the position under the mounting head 27, the mounting head 27 is descended to place the upper chip 15 on the lower chip 14 as shown in FIG. 4B. At this point, by controlling the positioning table 16 taking account of the positional inconsistency between the connection terminals 14a and the solder bumps 15a detected in the previous recognizing step, the solder bumps 15a are positioned correctly to the connection terminals 14a.

Then, the upper chip 15 is heated by the mounting head 27, so that the upper chip 15 is mounted on the lower chips 14 by melting the solder bumps 15a and being bonded to the connection terminals 14a (mounting step). As a result, the integrated component 19 is formed by mounting the upper chips 15 on the lower chips 14. At this time, height of the mounting head 27 is controlled to keep a clearance between the upper chip 15 and the lower chip 14 adequately, so that troubles caused by flowing molten solder of the solder bumps 15a unintended way can be prevented.

After completed the solder bonding, the suction holding of the upper chip 15 by the component holding nozzle 28 is released and the mounting head 27 is ascended and the suction holding of the lower chip 14 by the mounting stage 18 is released so that transporting of the integrated component 19 is started. Namely, the component carrying-out head 33 is moved to the component mounting position [P2] and descended toward the mounting stage 18 so as to hold the upper chip 15 of the integrated component 19 with the component holding nozzle 34 by suction. Then a carrying-out operation is conducted by the component carrying-out head 33 so as to carry the upper chip 15 held by the component holding nozzle 34 out of the mounting stage 18 together with the lower chip 14 and to store on the component storage tray 32 by releasing the suction holding by the component holding nozzle 34 (carrying-out step).

As described above, in a component mounting apparatus of the invention, in a component mounting that the upper chip 15 is mounted the lower chip 14, the lower chip 14 is transported to the mounting stage 18 by the component transporting unit 4, subsequently, the upper chip 15 transferred from the component transporting unit 4 is mounted on the lower chip 14 by the mounting head 27 By this construction, a component mounting operation to manufacture semiconductor devices having COC structure, namely a mounting operation by bonding a pair of chip components having almost the same size each other, can be effectively performed.

In addition, by a structure provided with the transportation conveyer 31, the lower chips 14 stored in the component storage tray 32 can be effectively fed by in-line manner.

Embodiment 2

Figure 5:
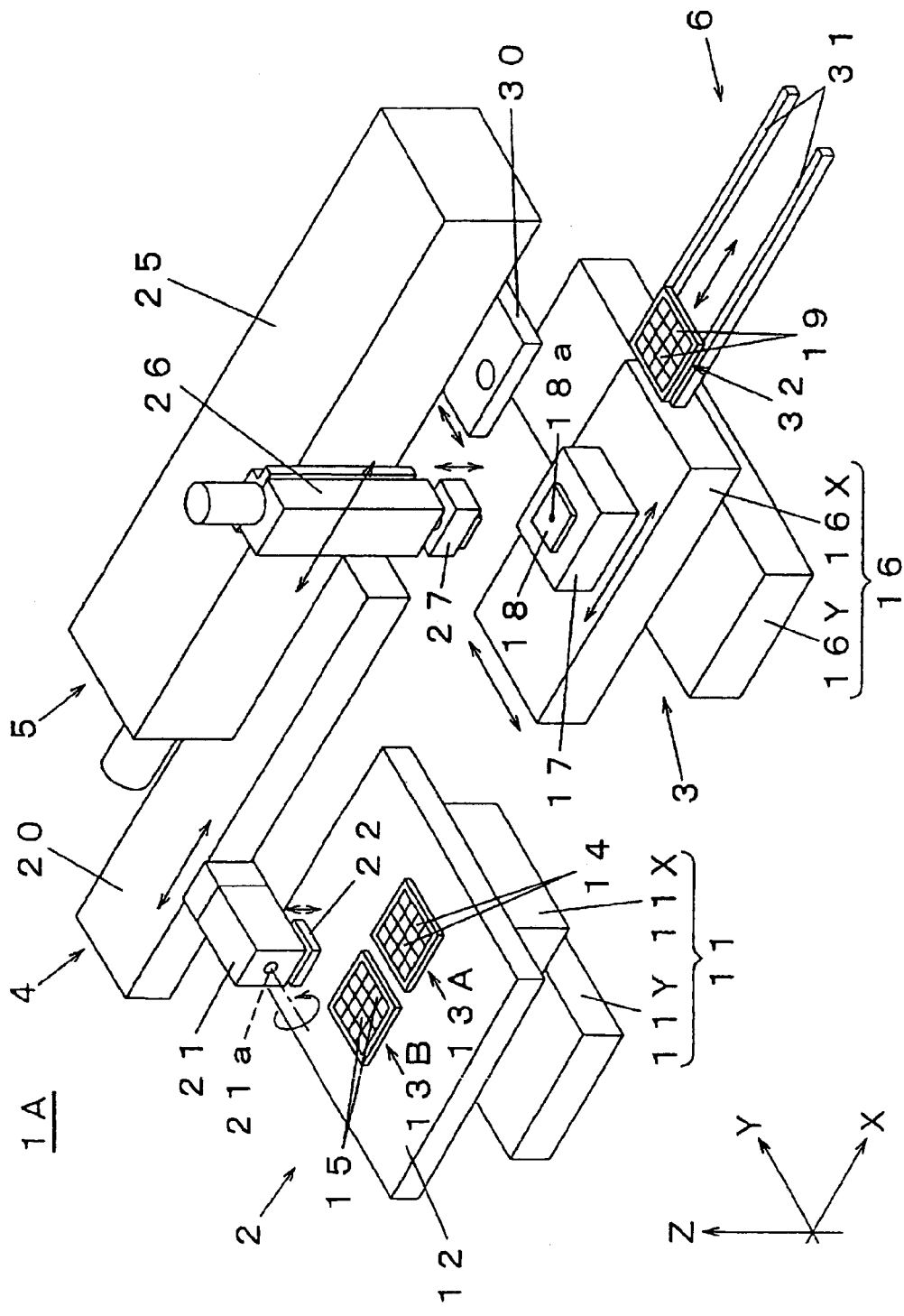
FIG. 5 is a perspective view showing a component mounting apparatus according to Embodiment 2 of the present invention.
Figure 6:
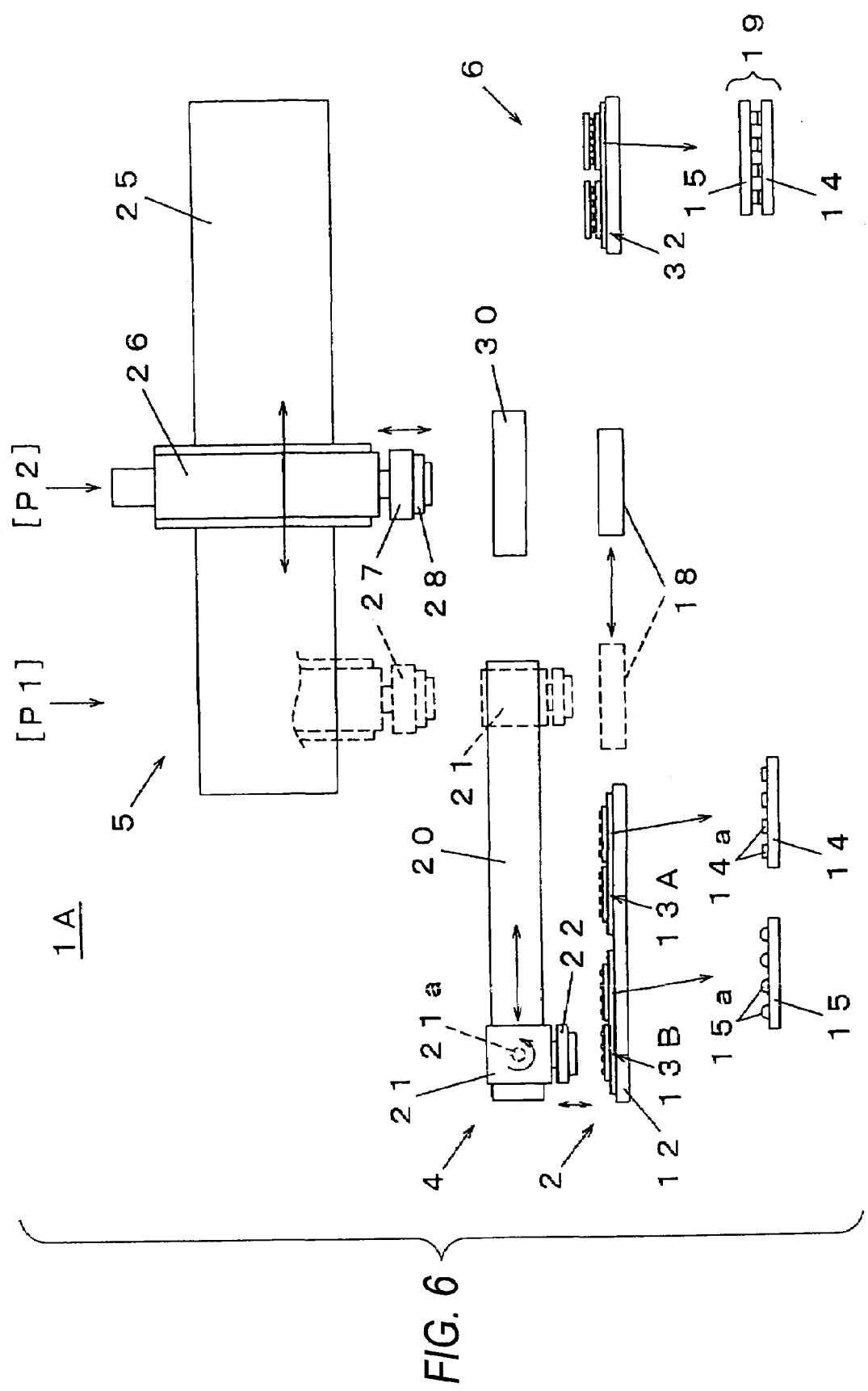
FIG. 6 is a front view showing the component mounting apparatus according to Embodiment 2 of the present invention.
Figure 7A:
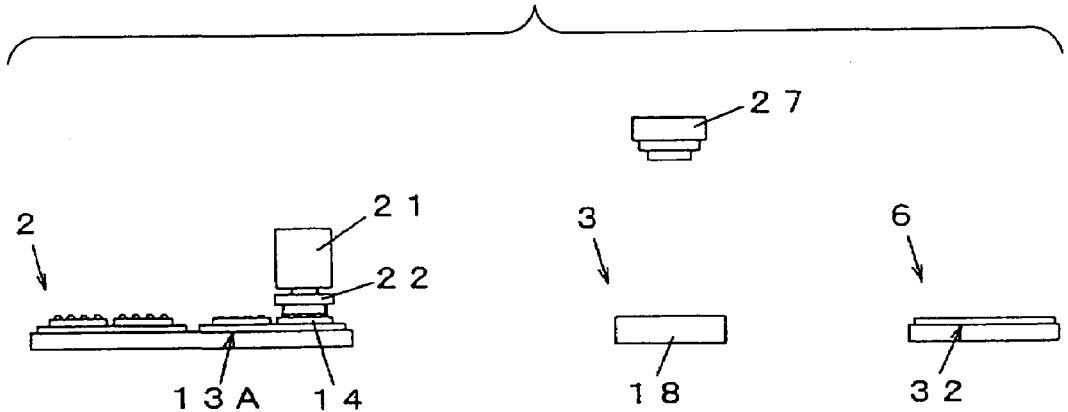
FIGS. 7A-7D depict views of steps in a component mounting method according to Embodiment 2 of the present invention.
Figure 7B:
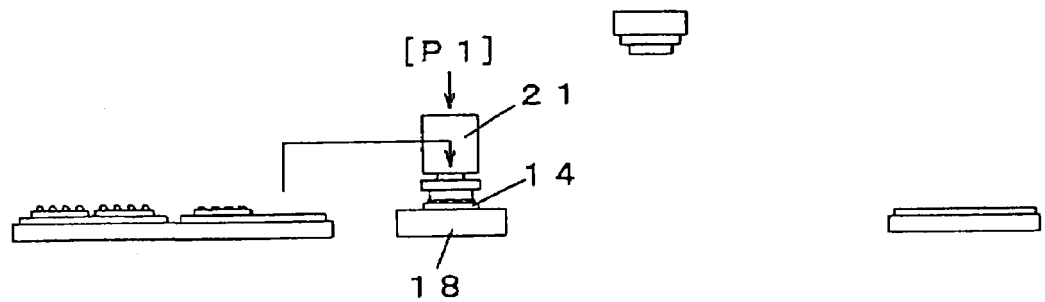
Figure 7C:
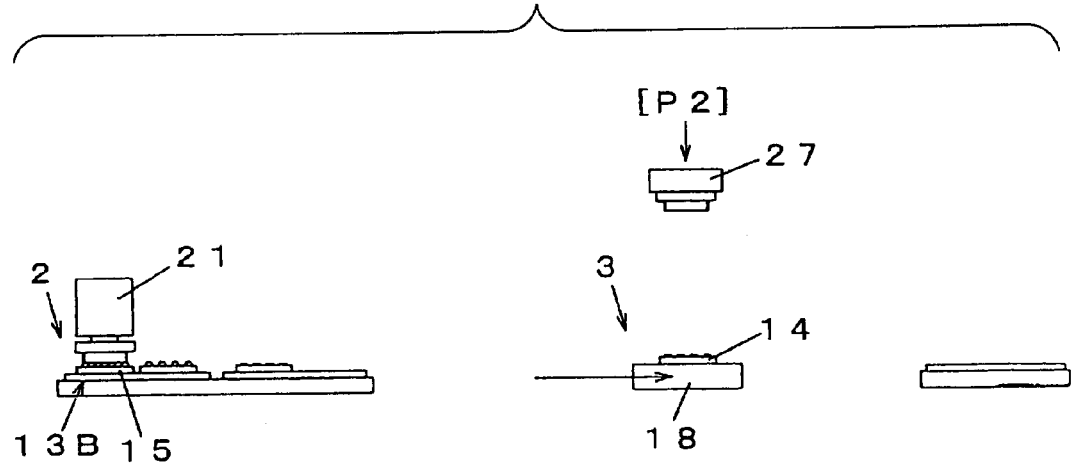
Figure 7D:
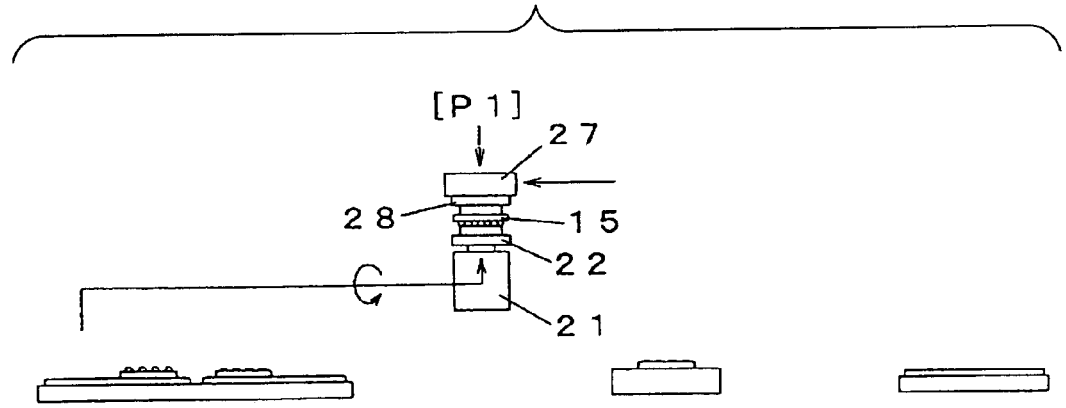
Figure 8A:
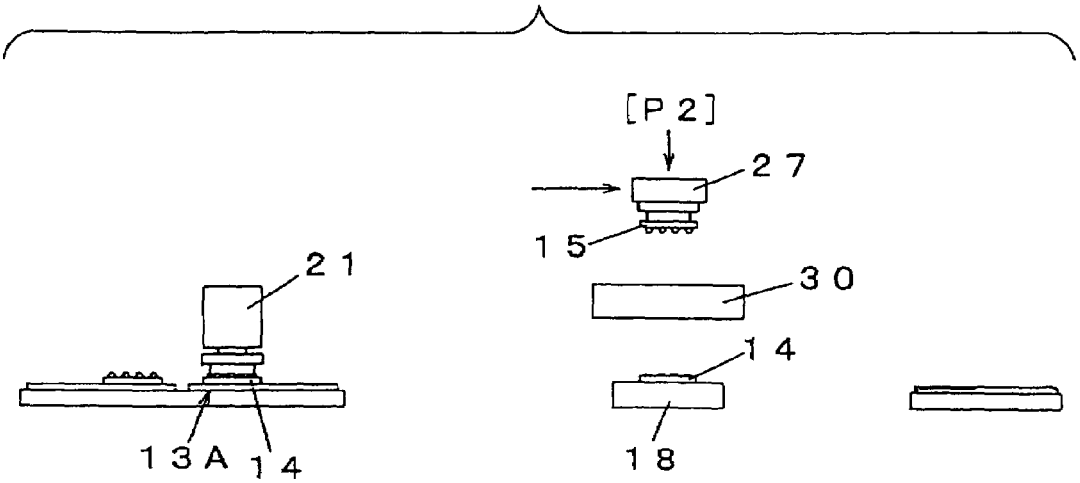
FIGS. 8A-8D depict views of steps in a component mounting method according to Embodiment 2 of the present invention.
Figure 8B:
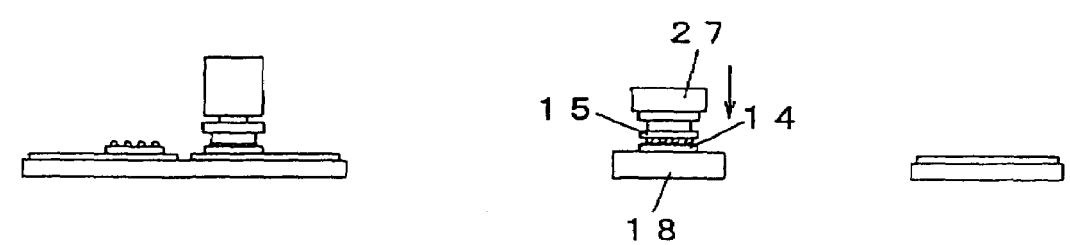
Figure 8C:
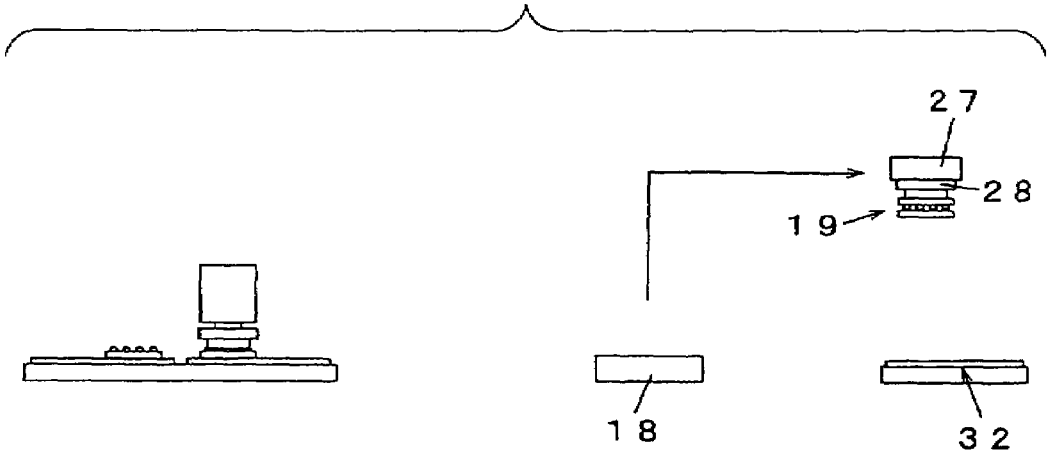
Figure 8D:
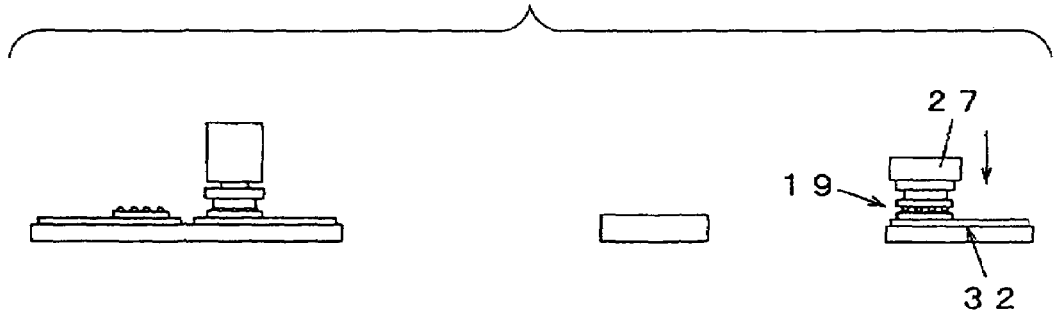

FIG. 5 is a perspective view showing a component mounting apparatus according to Embodiment 2 of the present invention; FIG. 6 is a front view showing the component mounting apparatus according to Embodiment 2 of the present invention; and FIGS. 7A and 8D are explanatory views showing process of a component mounting method according to Embodiment 2 of the present invention.

A component mounting apparatus 1A shown in FIG. 5 and 6 has a construction where the component carrying-out unit 6 and the component transporting head 33 are eliminated from the component mounting apparatus 1. The structure constituted by the component storing unit 2, the component positioning unit 3, the component transporting unit 4 and the component mounting unit 5 is similar to the component mounting apparatus 1. In Embodiment 2, the component mounting apparatus 1A is configured so that the integrated component 19 formed by mounting the upper chip 15 on the lower chip 14 on the mounting stage 18 is carried out by being held with the mounting head 27 directly after mounting. In other words, in Embodiment 2, the mounting unit which mounts the lower chip 14 on the upper chip 15 doubles with the component carrying-out unit which carries the upper chip 15 mounted on the lower chip 14 out of the mounting stage 18.

Next, referring to FIGS. 7A through 8D, a component mounting operation performed by the component mounting apparatus 1A will be described. FIGS. 7A through 7D and FIGS. 8A and 8B show operations similar to those shown in FIGS. 3A and 3B, and FIGS. 4A and 4B, respectively. After completing the solder boding as shown in FIG. 8B, the holding of the lower chip 14 by suction on the mounting stage 18 is released, and the mounting head 27 is ascended and moved above the component carrying-out unit 6 while holding the upper head 15 together with the lower chip 14 by suction through the component holding nozzle 28 as shown in FIG. 8C. Subsequently, as shown in FIG. 8D, the integrated component 19 is stored in the component storage tray 32 by releasing the holding by suction through the component holding nozzle 28 after the upper chip 15 mounted on the lower chip 14 is carried out of the mounting stage 18 by the mounting head 27 (carrying-out step).

According to Embodiment 2, it is not necessary to provide separate head only for carrying out the component (see Embodiment 1), the apparatus structure can be simplified, and the cost for the apparatus can be reduced.

The invention provides an advantage that a component mounting operation to manufacture semiconductor devices having COC structure can be effectively performed and is therefore applicable in a field of manufacturing semiconductor devices in which another component is mounted on one component in a stacked manner.

What is claimed is:

1. A component mounting method of mounting a second component on a first component, characterized by the steps of:

a placing step of placing a first component on a mounting stage by a component transporting unit;

a holding step of holding a second component which is transferred to a mounting head by the component transporting unit; and a mounting step of mounting the second component held by the mounting head on the first component placed on the mounting stage.

2. A component mounting method according to claim 1, further comprising a recognizing step of recognizing the first component that is placed on the mounting stage and the second component that is held by the mounting head by a recognizing unit.

3. A component mounting method according to claim 1, further comprising a carrying-out step of carrying the second component mounted on the first component out of the mounting stage together with the first component by holding the component transporting unit.

\* \* \* \* \*